(12) United States Patent
Lee

(10) Patent No.: US 11,997,880 B2
(45) Date of Patent: May 28, 2024

(54) ORGANIC LIGHT EMITTING DISPLAY DEVICE

(71) Applicant: LG Display Co., Ltd., Seoul (KR)

(72) Inventor: JeongYeop Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 205 days.

(21) Appl. No.: 17/491,256

(22) Filed: Sep. 30, 2021

(65) Prior Publication Data

US 2022/0208914 A1 Jun. 30, 2022

(30) Foreign Application Priority Data

Dec. 30, 2020 (KR) ........................ 10-2020-0187565

(51) Int. Cl.
*H10K 59/121* (2023.01)
*H01L 29/417* (2006.01)
*H10K 59/124* (2023.01)

(52) U.S. Cl.
CPC ... *H10K 59/1213* (2023.02); *H01L 29/41733* (2013.01); *H10K 59/124* (2023.02)

(58) Field of Classification Search
CPC .......... H01L 29/41733; H01L 27/1225; H01L 27/124; H10K 59/124; H10K 59/352; H10K 59/1213
See application file for complete search history.

(56) References Cited

U.S. PATENT DOCUMENTS

| | | | |
|---|---|---|---|
| 2002/0074548 A1* | 6/2002 | Lee | H01L 29/66757 438/149 |
| 2008/0217688 A1* | 9/2008 | Matsukura | H01L 29/41733 257/E29.295 |
| 2020/0111855 A1* | 4/2020 | Bae | H10K 59/1213 |
| 2020/0144309 A1* | 5/2020 | Jeon | H01L 27/1255 |

FOREIGN PATENT DOCUMENTS

KR  10-2020-0002763 A  1/2020

* cited by examiner

*Primary Examiner* — Vongsavanh Sengdara
(74) *Attorney, Agent, or Firm* — Fenwick & West LLP

(57) ABSTRACT

An organic light emitting display device may include a first thin film transistor disposed above a substrate and including a first active layer that is formed of a first material and includes a first source region, a first channel region, and a first drain region, a first gate electrode, and a first source electrode and a first drain electrode, at least one insulating layer disposed on the first gate electrode and a second thin film transistor disposed on the insulating layer and including a second active layer that is formed of a second material and includes a second source region, a second channel region, and a second drain region, a second gate electrode, and a second source electrode and a second drain electrode, wherein the first source electrode and the first drain electrode are electrically connected to the first active layer through a first contact hole, and wherein the first active layer under the first contact hole has an asymmetric structure.

25 Claims, 13 Drawing Sheets

ORGANIC LIGHT EMITTING DISPLAY DEVICE

CROSS-REFERENCE TO RELATED APPLICATIONS

This application claims the benefit of and priority to Republic of Korea Patent Application No. 10-2020-0187565 filed on Dec. 30, 2020 in the Republic of Korea, the entire contents of which are hereby expressly incorporated by reference into the present application.

BACKGROUND

Technical Field

The present disclosure relates to an organic light emitting display device including a multi-type thin film transistor, and more particularly, to an organic light emitting display device in which different types of thin film transistors are disposed on a single substrate.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Specific examples of such a display device may include a liquid crystal display (LCD), and electroluminescent display devices such as an organic light emitting display (OLED) and a quantum dot light emitting display (QLED). In particular, the electroluminescent display device is a next-generation display device having self-luminous properties, and has superior characteristics in terms of a viewing angle, contrast, a response speed, power consumption, and the like, compared to the liquid crystal display.

The electroluminescent display device includes a display area for displaying an image and a non-display area disposed adjacent to the display area. In addition, the display area includes pixel circuits and light emitting elements. A plurality of thin film transistors are positioned in the pixel circuits to drive the light emitting elements disposed in a plurality of pixels.

Thin film transistors may be classified according to a material constituting a semiconductor layer. Among them, a low temperature poly-silicon (LTPS) thin film transistor and an oxide semiconductor thin film transistor are the most widely used transistors.

Meanwhile, technology development of electroluminescent display devices including a multi-type thin film transistor in which an LTPS thin film transistor and an oxide semiconductor thin film transistor are formed on the same substrate is being actively conducted.

SUMMARY

The inventors of the present disclosure have recognized that, in a method of manufacturing an organic light emitting display device, operating characteristics of a pixel can be improved by forming a plurality of thin film transistors with different semiconductors.

Accordingly, in order to form a plurality of thin film transistors with different semiconductors, the inventors of the present disclosure have invented a display device capable of reducing damage to semiconductor elements while forming respective semiconductors of the plurality of thin film transistors on different layers.

Meanwhile, as the plurality of thin film transistors are formed on different layers, there may occur a problem in which a residual inorganic layer remains or etch uniformity is lowered due to insulating layers stacked with a large thickness, in forming contact holes of an LIPS thin film transistor.

Accordingly, an object of the present disclosure is to provide an organic light emitting display device capable of reducing a device influence due to a remaining inorganic layer in a contact area.

Objects of the present disclosure are not limited to the above-mentioned objects, and other objects, which are not mentioned above, can be clearly understood by those skilled in the art from the following descriptions.

An organic light emitting display device according to an exemplary embodiment of the present disclosure may include a first thin film transistor disposed above a substrate and including a first active layer that is formed of a first material and includes a first source region, a first channel region, and a first drain region, a first gate electrode that overlaps the first active layer with a first gate insulating layer interposed therebetween, and a first source electrode and a first drain electrode that are electrically connected to the first active layer, at least one insulating layer disposed on the first gate electrode and a second thin film transistor disposed on the insulating layer and including a second active layer that is formed of a second material and includes a second source region, a second channel region, and a second drain region, a second gate electrode that overlaps the second active layer with a second gate insulating layer interposed therebetween, and a second source electrode and a second drain electrode that are electrically connected to the second active layer, wherein the first source electrode and the first drain electrode are electrically connected to the first active layer through a first contact hole, and wherein the first active layer under the first contact hole has an asymmetric structure.

A light emitting display device according to an exemplary embodiment of the present disclosure may include a light emitting element, a first thin film transistor disposed on a substrate and including a first active layer formed of a first material and includes a first source region, a first channel region, and a first drain region, a first gate electrode overlapping the first active layer, a first gate insulating layer between the first active layer and the first gate electrode, and a first source electrode and a first drain electrode electrically connected to the first active layer. The light emitting display device further includes one or more insulating layers disposed on the first gate electrode, and a second thin film transistor disposed on the at least one insulating layer. At least one of the first source electrode or the first drain electrode is electrically connected to the first active layer through a first contact hole in the one or more insulating layers that exposes a side surface of the first active layer, and the at least one of the first source electrode or the first drain electrode may contact the side surface of the first active layer.

Other detailed matters of the exemplary embodiments are included in the detailed description and the drawings.

In an organic light emitting display device according to an exemplary embodiment of the present disclosure, an active layer under a contact hole of an LTPS thin film transistor is asymmetrically designed to thereby be in side contact with source and drain electrodes, an influence of a remaining inorganic layer in a contact area can be reduced. Accordingly, it is possible to reduce non-uniformity of contact resistance in the contact area and reduce spot defects.

The effects according to the present disclosure are not limited to the contents exemplified above, and more various effects are included in the present specification.

DETAILED DESCRIPTION

Figure 1:
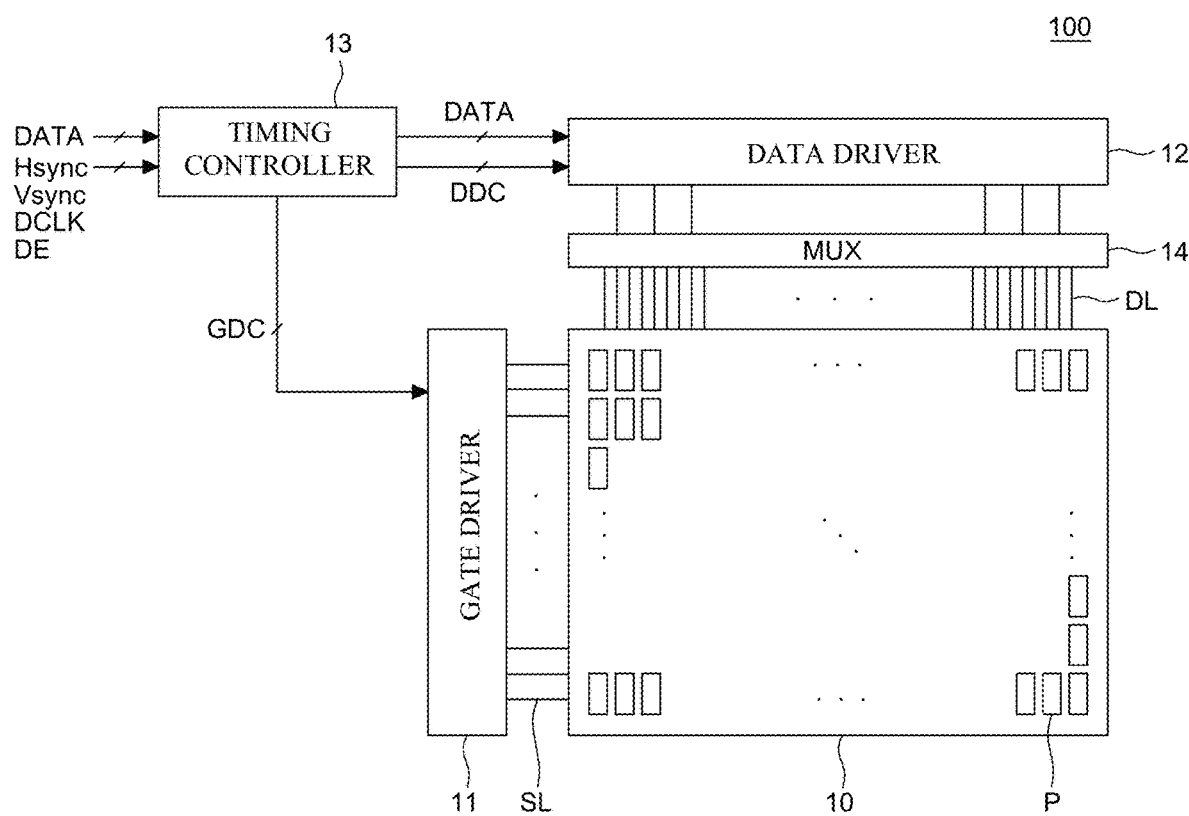
FIG. 1 is a block diagram illustrating an organic light emitting display device including a multi-type thin film transistor according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

In an organic light emitting display device including a multi-type thin film transistor according to an exemplary embodiment of the present disclosure, at least two types of thin film transistors may be formed on the same substrate. The multi-type thin film transistor refers to different types of thin film transistors formed on a single substrate. Here, as at least two types of thin film transistors, a low temperature poly-silicon (LTPS) thin film transistor using a polysilicon material as an active layer and an oxide semiconductor thin film transistor using a metal oxide as an active layer may be used.

In the organic light emitting display device including the multi-type thin film transistor according to an exemplary embodiment of the present disclosure, an LTPS thin film transistor using LTPS is used as a thin film transistor using a polysilicon material as an active layer. Since the polysilicon material has low energy consumption and excellent reliability due to high mobility (100 cm$^2$/Vs or more) thereof, the LIPS thin film transistor may be applied to a multiplexer MUX and/or a gate driver for driving elements that drive thin film transistors for display elements, and it is preferable to be applied as a driving thin film transistor in a pixel in an organic light emitting display device.

In the organic light emitting display device including a multi-type thin film transistor according to an exemplary embodiment of the present disclosure, an oxide semiconductor thin film transistor using an oxide semiconductor material as an active layer may be used. Since the oxide semiconductor material has a bandgap greater than that of a silicon material, electrons do not pass the bandgap in an off state and thus, off-current is low. Accordingly, the oxide semiconductor thin film transistor is suitable for a switching thin film transistor having a short on-time and a long off-time. In addition, since the off-current is small, a size of an auxiliary capacitor can be reduced, so that the oxide semiconductor thin film transistor is suitable for a high-resolution display device.

The organic light emitting display device including a multi-type thin film transistor according to an exemplary embodiment of the present disclosure may provide an optimal function by disposing an LPTS thin film transistor and an oxide semiconductor thin film transistor having different properties on the same substrate.

FIG. 1 is a block diagram illustrating an organic light emitting display device including a multi-type thin film transistor according to an exemplary embodiment of the present disclosure.

Referring to FIG. 1, an organic light emitting display device 100 may include a display panel 10, a gate driver 11, a data driver 12, a multiplexer (MUX) 14, and a timing controller 13.

The timing controller 13 controls a display panel driving circuit including the gate driver 11 and the data driver 12 for writing data of an input image to pixels P of the display panel 10. When the display panel 10 further includes a touch sensing unit, the display panel driving circuit may further include a touch sensing driving unit.

In the display panel 10, a plurality of data lines DL and a plurality of scan lines SL cross each other, and a plurality of the pixels P are disposed in a matrix form. In addition, various lines such as an initialization voltage line, an emission control signal line, a high potential voltage line, and a low potential voltage line may be further disposed in the display panel 10, but the present disclosure is not limited thereto.

Each of the plurality of pixels P is a pixel for realizing one color, and the plurality of pixels P may include a red pixel, a green pixel, and a blue pixel. Also, in order to improve a luminance and lifespan of the display panel 10, the plurality of pixels P may further include a white pixel. The red pixel, the green pixel, and the blue pixel (and the white pixel) form one group, so that a desired color can be realized.

The data driver 12 converts digital video data DATA of the input image received from the timing controller 13 into an analog data voltage every frame, and then supplies the data voltage to the data lines DL. The data driver 12 may output the data voltage using a digital-to-analog converter (DAC) that converts digital data into a gamma compensation voltage.

For example, the multiplexer 14 may be disposed between the data driver 12 and the data lines DL of the display panel 10. The multiplexer 14 may reduce the number of output channels of the data driver 12 by dividing a data voltage output through one output channel from the data driver 12 into N (N is a positive integer greater than or equal to 2) channels. The multiplexer 14 may be omitted depending on a resolution and use of the organic light emitting display device 100. The multiplexer 14 may be configured as a switch circuit, and the switch circuit is turned on/off under the control of the timing controller 13.

The gate driver 11 outputs scan signals and emission control signals under the control of the timing controller 13 and selects the pixel P that is charged with a data voltage through the scan line SL and adjusts an emission timing. The gate driver 11 may shift the scan signals and the emission control signals using a shift register, and sequentially supply the corresponding signals to the scan line SL. The shift register of the gate driver 11 may be directly formed on a substrate of the display panel 10 by a gate-driver in panel (GIP) method.

The timing controller 13 receives digital video data DATA of an input image and timing signals synchronized with the digital video data DATA from a host system. The timing signals may include a vertical synchronization signal Vsync, a horizontal synchronization signal Hsync, a clock signal DCLK, a data enable signal DE and the like. The host system may be any one of various electronic devices such as a television system, a set-top box, a navigation system, a digital video disc (DVD) player, a Blu-ray player, a personal computer (PC), a home theater system, a phone system, and the like.

The timing controller 13 may generate a data timing control signal DDC for controlling an operational timing of the data driver 12, MUX selection signals for controlling an operational timing of the multiplexer 14, and a gate timing control signal GDC for controlling an operational timing of the gate driver 11 based on the timing signals Vsync, Hsync, DCLK and DE that are received from the host system.

The data timing control signal DDC may include a source start pulse SSP, a source sampling clock SSC, a polarity control signal POL, and a source output enable signal SOE, and the like. The source start pulse SSP controls a sampling start timing of the data driver 12. The source sampling clock SSC is a clock for shifting a data sampling timing. The polarity control signal POL controls polarity of a data signal output from the data driver 12. If a signal transmission interface between the timing controller 13 and the data driver 12 is a mini-LVDS (low voltage differential signaling) interface, the source start pulse SSP and the source sampling clock SSC may be omitted.

The gate timing control signal GDC may include a gate start pulse GSP, a gate shift clock CLK, a gate output enable signal GOE, and the like. In the case of a GIP circuit, the gate output enable signal GOE may be omitted. The gate start pulse GSP may be generated once at the beginning of a frame period in every frame period and be input to the shift register. The gate start pulse GSP may control a start timing at which a gate pulse is output in every frame period. The clock CLK is input to the shift register and may control a shift timing of the shift register. The gate output enable signal GOE defines an output timing of the gate pulse.

Figure 2A:
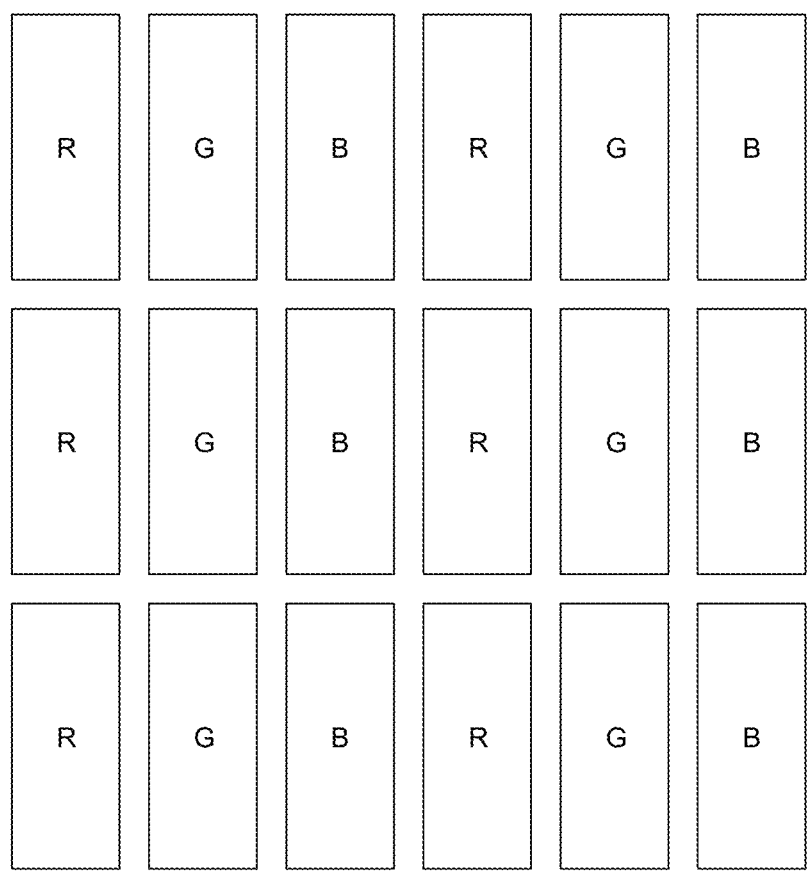
FIG. 2A and FIG. 2B are plan views of sub-pixels disposed in an active area AA illustrated in FIG. 1 according to an embodiment of the present disclosure.
Figure 2B:
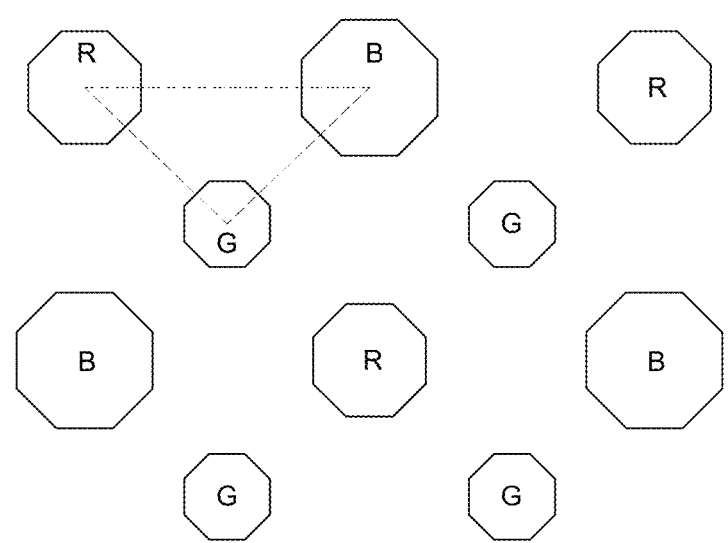

FIG. 2A and FIG. 2B are plan views of sub-pixels disposed in an active area AA illustrated in FIG. 1 according to embodiments of the present disclosure.

The active area AA may display an image through unit pixels disposed in a matrix form. The unit pixel may be composed of red (R), green (G), and blue (B) sub-pixels, or be composed of red (R), green (G), blue (B), and white (W) sub-pixels. For example, red (R), green (G), and blue (B) sub-pixels may be disposed in a row on the same imaginary horizontal line, as shown in FIG. 2A, or red (R) green (G), and blue (B) sub-pixels may be disposed to be spaced apart from each other and arranged in a virtual triangular structure, as shown in FIG. 2B. A shape of the unit pixels is not limited to those of FIGS. 2A and 2B and may be implemented variously.

Figure 3:
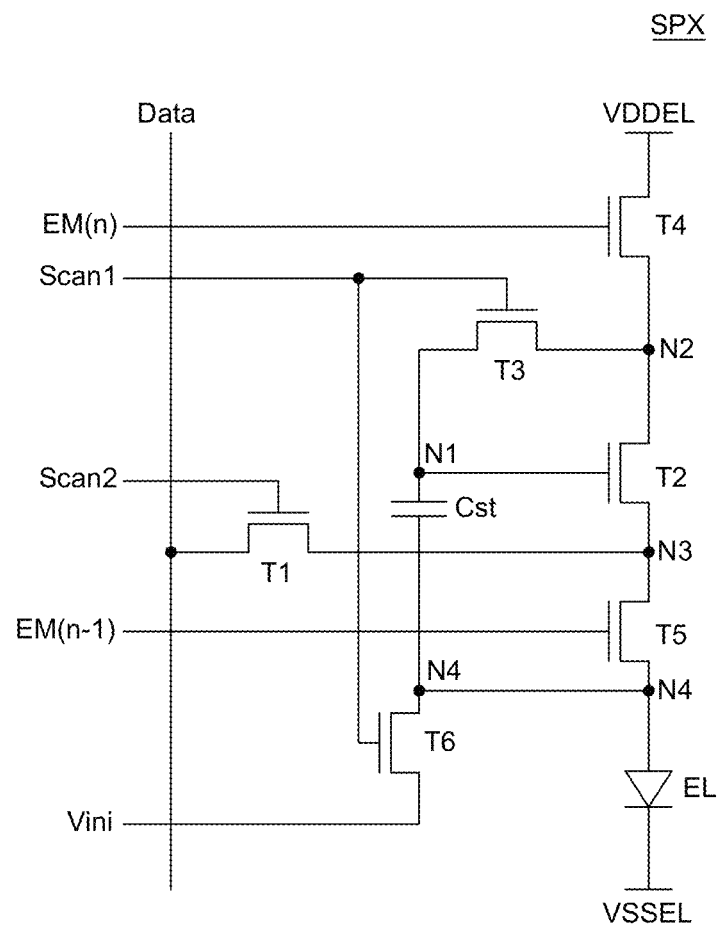
FIG. 3 is a circuit diagram illustrating one pixel driving circuit in the organic light emitting display device according to an exemplary embodiment of the present disclosure.

FIG. 3 is a circuit diagram illustrating one pixel driving circuit in the organic light emitting display device according to an exemplary embodiment of the present disclosure.

Referring to FIG. 3, a sub-pixel SPX includes a light emitting element EL and a pixel driving circuit, and for example, the pixel driving circuit may include six transistors and one capacitor to supply a driving current to the light emitting element EL. The present disclosure is not limited to an equivalent circuit of the sub-pixel SPX illustrated in FIG. 3 and may be implemented in various manners.

Specifically, the pixel driving circuit includes a driving transistor T2, a first switching transistor T1 and third to sixth switching transistors T3 to T6, and one storage capacitor Cst.

Specifically, the driving transistor T2 may include a gate node that is connected to a first node N1, a drain node that is connected to a second node N2, and a source node that is connected to a third node N3. The first node N1 may be connected to one node of the storage capacitor Cst, the second node N2 may be connected to the third switching transistor T3 and a fourth switching transistor T4, and the third node N3 may be connected to the first switching transistor T1 and a fifth switching transistor T5. The source node of the driving transistor T2 may be electrically connected to an organic light emitting element. The driving transistor T2 may be referred to as a pixel emission driving element.

The source node of the driving transistor T2 may be connected to a drain node of the fifth switching transistor T5 and the third node N3.

The drain node of the driving transistor T2 may be connected to a high potential voltage line providing a high potential voltage VDDEL through the fourth transistor T4. Accordingly, during a light emission period, the driving transistor T2 is turned on by receiving the high potential voltage VDDEL through the fourth transistor T4 and may provide a driving current to the light emitting element EL.

The first switching transistor T1 may include a gate node that is connected to a second scan signal line providing a second scan signal SCAN2, a drain node that is connected to a data line providing a data voltage Data, and a source node that is connected to the third node N3. The first switching transistor T1 may be turned on or turned off by the second scan signal SCAN2. The first switching transistor T1 may be turned on and supply the data voltage Data to the third node N3.

The third switching transistor T3 may include a gate node that is connected to a first scan signal line to which a first scan signal SCAN1 is provided, a drain node that is connected to the second node N2, and a source node that is connected to the first node N1. The third switching transistor T3 may be turned on and diode-connect the gate node and the drain node of the driving transistor T2 to thereby sense a threshold voltage of the driving transistor T2.

The fourth switching transistor T4 may include a gate node that is connected to an nth emission control signal line to which an nth emission control signal EM[n] is provided, a drain node that is connected to the high potential voltage line, and a source node that is connected to the second node N2.

The fourth switching transistor T4 may be turned on by the nth emission control signal EM[n] and supply the high potential voltage VDDEL to the drain node of the driving transistor T2. In this manner, the fourth switching transistor T4 supplies the high potential voltage VDDEL to the drain node of the driving transistor T2 so that a drain-source current of the driving transistor T2 flows through the light emitting element EL. Accordingly, the driving transistor T2 may express grayscale by adjusting the amount of the current provided to the light emitting element EL according to the data voltage Data.

The fifth switching transistor T5 may include a gate node that is connected to an (n−1)th emission control signal line to which an (n−1)th emission control signal EM[n−1] is provided, a drain node that is connected to the third node N3, and a source node that is connected to a fourth node N4. In order to sample the threshold voltage of the driving transistor T2 through a coupling effect of the storage capacitor Cst, the fifth switching transistor T5 is turned on and may provide the data voltage Data of the third node N3 to the fourth node N4. Also, while the light emitting element EL emits light, the fifth switching transistor T5 is turned on and may provide a driving current to the light emitting element EL.

The sixth switching transistor T6 may include a gate node that is connected to the second scan signal line to which the first scan signal SCAN1 is provided, a source node that is connected to an initialization voltage line to which an initialization voltage Vini is provided, and a drain node that is connected to the fourth node N4.

The sixth switching transistor T6 may be turned on by the first scan signal SCAN1 and supply the initialization voltage Vini to the fourth node N4 to thereby discharge an anode of the light emitting element EL.

The storage capacitor Cst is connected to the first node N1 and the fourth node N4 and may store a voltage applied to the gate node of the driving transistor T2. That is, the storage capacitor Cst is electrically connected to the first node N1 and the fourth node N4 and may store a difference between the voltage supplied to the gate node of the driving TFT T2 and a voltage supplied to the anode of the light emitting element EL.

Figure 4:
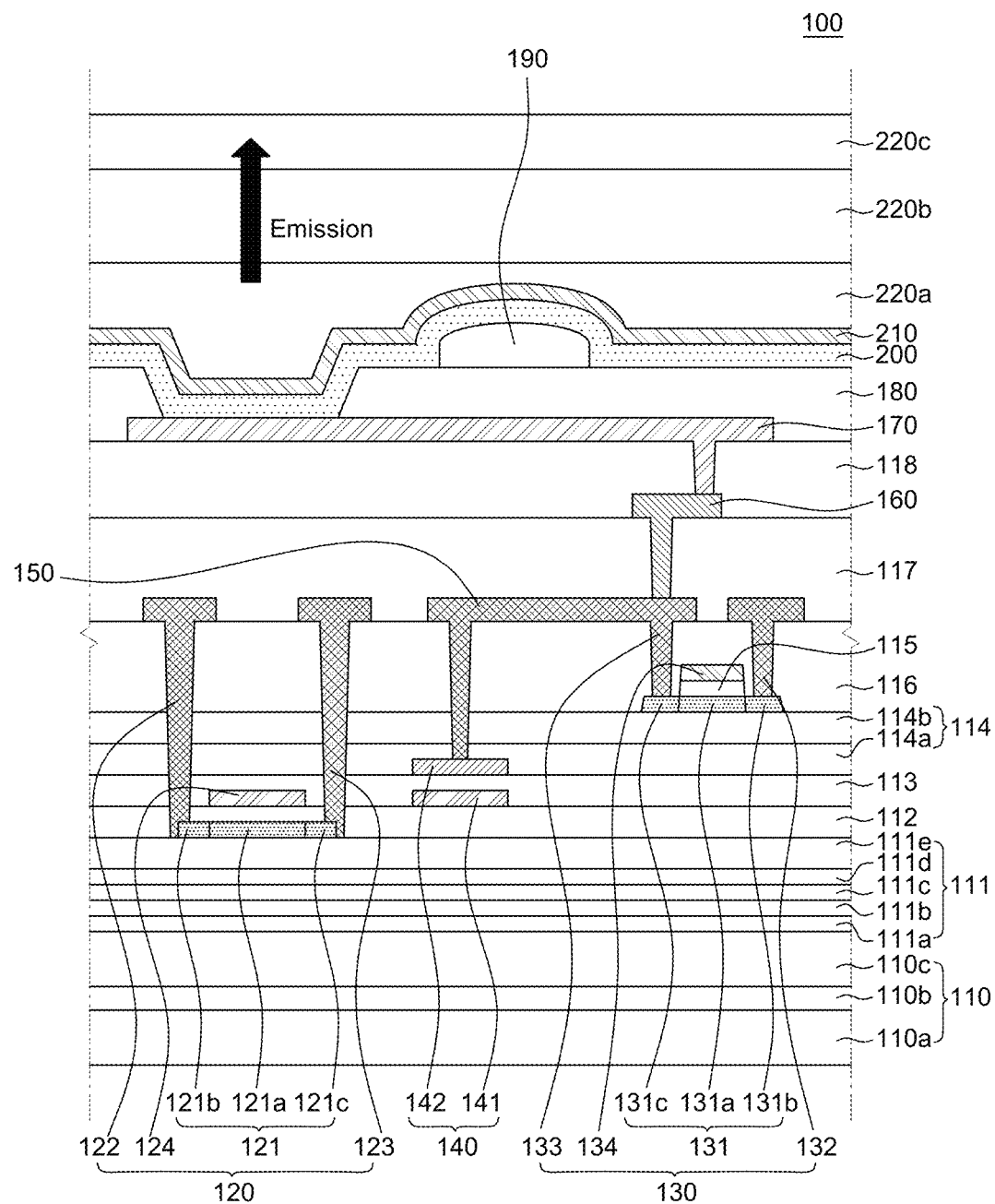
FIG. 4 is a cross-sectional view illustrating the organic light emitting display device according to an exemplary embodiment of the present disclosure.

FIG. 4 is a cross-sectional view of the organic light emitting display device according to an exemplary embodiment of the present disclosure.

Referring to FIG. 4, the organic light emitting display device 100 according to an exemplary embodiment of the present disclosure may include a substrate 110, a first buffer layer 111, a first thin film transistor 120, a second thin film transistor 130, a storage capacitor 140, a first gate insulating layer 112, a first interlayer insulating layer 113, a second buffer layer 114, a second gate insulating layer 115, a second interlayer insulating layer 116, a first planarization layer 117, a second planarization layer 118, a first electrode 170, a connection electrode 150, a bank 180, an auxiliary electrode 160, a spacer 190, a light emitting structure 200, a second electrode 210 and encapsulation units 220a, 220b, and 220c.

The substrate 110 may support various components of the organic light emitting display device 100. The substrate 110 may be formed of glass or a plastic material having flexibility. When the substrate 110 is formed of a plastic material, it may be formed of, for example, polyimide (PI). When the substrate 110 is formed of polyimide (PI), a display device manufacturing process is conducted in a situation where a support substrate formed of glass is disposed under the substrate 110, and after the display device manufacturing process is completed, the support substrate can be released. Also, after the support substrate is released, a back plate for supporting the substrate 110 may be disposed under the substrate 110.

When the substrate 110 is formed of polyimide (PI), moisture permeates through the substrate 110 formed of polyimide (PI) to the first thin film transistor 120 or the light emitting structure 200, so that performance of the organic light emitting display device 100 may be degraded. The organic light emitting display device 100 according to the exemplary embodiment of the present disclosure may be formed of double polyimides (PI) in order to prevent the performance of the organic light emitting display device 100 from being degraded due to moisture permeation. And, by forming an inorganic layer between two polyimides (PI), it is possible to block a moisture component from passing through a lower polyimide (PI), so that product performance reliability can be improved.

In addition, in the organic light emitting display device 100 according to an exemplary embodiment of the present disclosure, an inorganic layer is formed between two polyimides (PI), electric charges that are charged in a lower polyimide PI ate blocked, so that product reliability can be improved. In addition, since a process of forming a metal layer in order to block the electric charge charged in the polyimide (PI) can be omitted, process simplification may be allowed and a production cost can be reduced.

In the organic light emitting display device 100 using polyimide (PI) as the substrate 110, it is very important to secure environmental reliability performance and performance reliability of the panel.

Accordingly, the organic light emitting display device 100 according to the exemplary embodiment of the present disclosure may implement a structure for securing environmental reliability performance of a product by using double polyimides (PI) as a substrate. For example, as shown in FIG. 4, the substrate 110 of the organic light emitting display device 100 may include a first polyimide layer 110a, a second polyimide layer 110c, and an inorganic insulating layer 110b formed between the first polyimide layer 110a and the second polyimide layer 110c, but is not limited thereto. In a case in which electric charges are charged in the first polyimide layer 110a, the inorganic insulating layer 110b may serve to block the electric charge from affecting the first thin film transistor 120 through the second polyimide layer 110b. In addition, the inorganic insulating layer 110b may serve to block a moisture component from passing through the first polyimide layer 110b and penetrating upwardly.

The inorganic insulating layer 110b may be formed of a single layer of silicon nitride (SiNx) or silicon oxide (SiOx) or multiple layers thereof. In the organic light emitting display device 100 according to the exemplary embodiment of the present disclosure, the inorganic insulating layer 110b may be formed of a silicon oxide (SiOx) material. For example, the inorganic insulating layer 110b may be formed of a silicon dioxide material (silica or silicon dioxide: $SiO_2$). However, the present disclosure is not limited thereto, and the inorganic insulating layer 110b may be formed of double layers of silicon dioxide ($SiO_2$) and silicon nitride (SiNx).

The first buffer layer 111 may be formed on an entire surface of the substrate 110. The first buffer layer 111 may be formed of a single layer of silicon nitride (SiNx) or silicon oxide (SiOx) or multiple layers thereof. The first buffer layer 111 may improve adhesion between layers formed on the first buffer layer 111 and the substrate 110, and block alkali components and the like, leaking from the substrate 110. In addition, the first buffer layer 111 may not be an essential component, and may be omitted based on a type and material of the substrate 110, a structure and type of the thin film transistor, and the like.

According to an exemplary embodiment of the present disclosure, the first buffer layer 111 may be formed as a multilayer in which silicon dioxide ($SiO_2$) and silicon nitride (SiNx) are alternately formed. Specifically, the first buffer layer 111 may be formed of (n+1) layers. Here, n means an even number including 0, such as 0, 2, 4, 6, or 8. Accordingly, when n=0, the first buffer layer 111 is formed as a single layer. In addition, the first buffer layer 111 may be silicon nitride (SiNx) or silicon oxide (SiOx). When n=2, the first buffer layer 111 may be formed as a triple layer. When the first buffer layer 111 is formed as a triple layer, an upper layer and a lower layer thereof may be silicon oxide (SiOx), and an intermediate layer thereof disposed between the upper layer and the lower layer may be silicon nitride (SiNx). And, when n=4, the first buffer layer 111 may be formed of a quintuple layer. When the first buffer layer 111 is formed of a quintuple layer, as shown in FIG. 4, a 1-a buffer layer 111a may be formed on the substrate 110. In addition, the 1-a buffer layer 111a may be formed of a silicon dioxide ($SiO_2$) material. In addition, a 1-b buffer layer 111b may be formed of a silicon nitride (SiNx) material, and may be disposed on the 1-a buffer layer 111a. In addition, a 1-c buffer layer 111c may be formed of a silicon dioxide ($SiO_2$) material, and may be disposed on the 1-b buffer layer 111b. In addition, a 1-d buffer layer 111d may be formed of a silicon nitride (SiNx) material, and may be disposed on the 1-c buffer layer 111c. In addition, a 1-e buffer layer 111e may be formed of a silicon dioxide (SiO2) material, and may be disposed on the 1-d buffer layer 111d. As such, when n is an even number greater than or equal to 2, the first buffer layer 111 may be formed as a multilayer in which silicon oxide (SiOx) and silicon nitride (SiNx) are alternately formed. In addition, an uppermost layer and a lowermost layer of the first buffer layer 111 that is formed of the multilayer may be formed of a silicon oxide (SiOx) material. For example, the first buffer layer 111 formed of a plurality of layers may include an upper layer in contact with a first active layer 121 of the first thin film transistor 120, a lower layer in contact with the substrate 110, and an intermediate layer positioned between the upper and lower layers. In addition, the upper layer and the lower layer may be formed of a silicon oxide (SiOx) material. In addition, the upper layer of the first buffer layer 111 formed of the multilayer may be formed to be thicker than thicknesses of the lower layer and the intermediate layer.

For example, a thickness of the upper layer in contact with the first active layer 121 of the first thin film transistor 120 may be greater than the thicknesses of the lower layer and the intermediate layer of the first buffer layer 111. For example, when the first buffer layer 111 is a quintuple layer as shown in FIG. 4, the 1-e buffer layer 111e in contact with the first active layer 121 may be an upper layer. In addition, the 1-a buffer layer 111a in contact with the substrate 110 may be a lower layer. In addition, the 1-b buffer layer 111b, the 1-c buffer layer 111c, and the 1-d buffer layer 111d that are disposed between the 1-a buffer layer 111a and the 1-e buffer layer 111e may be intermediate layers. Here, a thickness of the 1-e buffer layer 111e which is the upper layer may be greater than a thickness of the 1-a buffer layer 111a which is the lower layer and a thickness of each of the 1-b buffer layer 111b, the 1-c buffer layer 111c, and the 1-d buffer layer 111d which are the intermediate layers. However, the present disclosure is not limited thereto.

In addition, in the first buffer layer 111 formed of the plurality of layers, a plurality of remaining layers except for the upper layer in contact with the first active layer 121 of the first thin film transistor 120 may all have the same thickness. For example, the 1-a buffer layer 111a, the 1-b buffer layer 111b, the 1-c buffer layer 111c and the 1-d buffer layer 111d, except for the 1-e buffer layer 111e in contact with the first active layer 121 may have the same thickness.

The first thin film transistor 120 may be disposed on the first buffer layer 111. The first thin film transistor 120 may include the first active layer 121, a first gate electrode 124, a first source electrode 122, and a first drain electrode 123. Here, according to a design of the pixel circuit, the first source electrode 122 may be a drain electrode, and the first drain electrode 123 may be a source electrode.

The first active layer 121 may include low temperature poly-silicon (LTPS). Since a polysilicon material has low energy consumption and excellent reliability due to has high mobility (100 $cm^2/Vs$ or more), it can be applied to a multiplexer (MUX) and/or a gate driver for a driving element that drives thin film transistors for a display element and can also be applied as the active layer 121 of the driving thin film transistor in the display device according to the embodiment. However, the present disclosure is not limited thereto. For example, it may be applied as an active layer 131 of the switching thin film transistor according to characteristics of the display device. Polysilicon is formed by depositing an amorphous silicon (a-Si) material on the first buffer layer 111 and performing a dehydrogenation process and a crystallization process, and the first active layer 121 may be formed by patterning the polysilicon. The first active layer 121 may include a first channel region 121a in which a channel is formed when the first thin film transistor 120 is driven, and a first source region 121b and a drain region 121c on both sides of the first channel region 121a. The first source region 121b means a portion of the first active layer 121 that is connected to the first source electrode 122, and the first drain region 121c means a portion of the first active layer 121 that is connected to the first drain electrode 123. The first source region 121b and the first drain region 121c may be formed by ion doping (impurity doping) of the first active layer 121. The first source region 121b and the first drain region 121c may be formed by performing ion-doping on the polysilicon material, and the first channel region 121a may refer to a portion that is not ion-doped and is left as the polysilicon material.

The first gate insulating layer 112 may be disposed on the first active layer 121. The first gate insulating layer 112 may be formed of a single layer of silicon nitride (SiNx) or silicon oxide (SiOx) or multiple layers thereof. Contact holes for connecting the first source electrode 122 and the first drain electrode 123 of the first thin film transistor 120 to the first source region 121b and the first drain region 121c of the first active layer 121 of the first thin film transistor 120, respectively, may be formed in the first gate insulating layer 112.

The first gate electrode 124 of the first thin film transistor 120 and a first capacitor electrode 141 of the storage capacitor 140 may be disposed on the first gate insulating layer 112.

In this case, the first gate electrode 124 and the first capacitor electrode 141 may be formed as a single layer or multilayer composed of any one of molybdenum (Mo), copper (Cu), titanium (Ti), aluminum (Al), chromium (Cr), gold (Au), nickel (Ni), and neodymium (Nd), or an alloy of them. The first gate electrode 124 may be formed on the first gate insulating layer 112 to overlap the first channel region 121a of the first active layer 121 of the first thin film transistor 120.

The first capacitor electrode 141 may be omitted based on driving characteristics of the organic light emitting display device 100 and a structure and type of the thin film transistor. The first gate electrode 124 and the first capacitor electrode 141 may be formed by the same process. In addition, the first gate electrode 124 and the first capacitor electrode 141 may be formed of the same material, and may be formed on the same layer.

The first interlayer insulating layer 113 may be disposed on the first gate insulating layer 112, the first gate electrode 124, and the first capacitor electrode 141. The first interlayer insulating layer 113 may be formed of a single layer of silicon nitride (SiNx) or silicon oxide (SiOx) or multiple layers thereof. Contact holes for exposing the first source region 121b and the first drain region 121c of the first active layer 121 of the first thin film transistor 120 may be formed in the first interlayer insulating layer 113.

A second capacitor electrode 142 of the storage capacitor 140 may be disposed on the first interlayer insulating layer 113. The second capacitor electrode 142 may be formed as a single layer or multilayer composed of any one of molybdenum (Mo), copper (Cu), titanium (Ti), aluminum (Al), chromium (Cr), gold (Au), nickel (Ni), and neodymium (Nd), or an alloy of them. The second capacitor electrode 142 may be formed on the first interlayer insulating layer 113 to overlap the first capacitor electrode 141. In addition, the second capacitor electrode 142 may be formed of the same material as the first capacitor electrode 141. The second capacitor electrode 142 may be omitted based on driving characteristics of the organic light emitting display device 100 and the structure and type of the thin film transistor.

The second buffer layer 114 may be disposed on the first interlayer insulating layer 113 and the second capacitor electrode 142. The first buffer layer 114 may be formed of a single layer of silicon nitride (SiNx) or silicon oxide (SiOx) or multiple layers thereof. In the second buffer layer 114, contact holes for exposing the first source region 121b and the first drain region 121c of the first active layer 121 of the first thin film transistor 120 may be formed. In addition, in the second buffer layer 114, a contact hole for exposing the second capacitor electrode 142 of the storage capacitor 140 may be formed.

The second buffer layer 114 may be formed of multiple layers. When the second buffer layer 114 is formed of multiple layers, an uppermost layer of the second buffer layer 114 in contact with the second active layer 131 may be formed of a silicon oxide (SiOx) material having a low hydrogen content. For example, the uppermost layer of the second buffer layer 114 may be formed of a silicon dioxide (SiO2) material. For example, as shown in FIG. 4, when the second buffer layer 114 is formed as a double layer, the second buffer layer 114 may include a second lower buffer layer 114a disposed on the first interlayer insulating layer 113 and a second upper buffer layer 114b disposed on the second lower buffer layer 114b. The second upper buffer layer 114b in direct contact with a lower portion of the second active layer 131 may have a relatively lower hydrogen content than the second lower buffer layer 114a. In addition, the second lower buffer layer 114a disposed on the first interlayer insulating layer 113 may have higher insulating properties than the second upper buffer layer 114b. The second upper buffer layer 114b of the second buffer layer 114 in direct contact with the second active layer 131 of the second thin film transistor 130 may be formed of silicon oxide (SiOx). For example, the second upper buffer layer 114b may be formed of silicon dioxide (SiO2). In addition, the second lower buffer layer 114a may be formed of silicon nitride (SiNx). However, the present disclosure is not limited thereto.

The second active layer 131 of the second thin film transistor 130 may be disposed on the second buffer layer 114. Here, the second thin film transistor 130 may include the second active layer 131, the second gate insulating layer 115, a second gate electrode 134, a second source electrode 132, and a second drain electrode 133. Here, according to the design of the pixel circuit, the second source electrode 132 may be a drain electrode, and the second drain electrode 133 may be a source electrode.

The second active layer 131 may include a second channel region 131a in which a channel is formed when the second thin film transistor 130 is driven, and a second source region 131b and a second drain region 131c on both sides of the second channel region 131a. The second source region 131b may mean a portion of the second active layer 131 that is connected to the second source electrode 132, and the second drain region 131c may mean a portion of the second active layer 131 that is connected to the second drain electrode 133.

The second active layer 131 may be formed of an oxide semiconductor. Since an oxide semiconductor material has a larger bandgap compared to a silicon material, electrons do not cross the bandgap in an off state, and thus, an off-current is low. Accordingly, a thin film transistor including an active layer formed of an oxide semiconductor may be suitable for a switching thin film transistor having a short on time and a long off time, but is not limited thereto. Depending on characteristics of the display device, it may be applied as a driving thin film transistor. And, since the off-current is small, a size of an auxiliary capacitor may be reduced, which is suitable for a high-resolution display device. For example, the second active layer 131 may be formed of a metal oxide, for example, may be formed of various metal oxides such as indium-gallium-zinc-oxide (IGZO) and the like. A description is made assuming that the second active layer 131 of the second thin film transistor 130 is formed of IGZO among various metal oxides, but the present disclosure is not limited thereto. The second active layer 131 of the second thin film transistor 130 may be formed of another metal oxide such as IZO(indium-zinc-oxide), IGTO(indium-gallium-tin-oxide), or IGO(indium-gallium-oxide), rather than IGZO.

The second active layer 131 may be formed by depositing a metal oxide on the second buffer layer 114, performing a heat treatment process for stabilization, and then, patterning the metal oxide.

An insulating material and a metallic material may be sequentially formed on the entire surface of the substrate including the second active layer 131, and a photoresist pattern may be formed on the metallic material.

The insulating material may be formed using a PECVD method, and the metallic material may be formed using a sputtering method.

Thereafter, the second gate electrode 134 may be formed by wet-etching the metallic material using a photoresist pattern PR as a mask. As a wet etchant for etching the metallic material, a material which selectively etches molybdenum (Mo), copper (Cu), titanium (Ti), aluminum (Al), chromium (Cr), gold (Au), nickel (Ni) and neodymium (Nd) or an alloy thereof that constitute the metallic material, and which does not etch the insulating material may be used.

The second gate insulating layer 115 may be formed by dry etching the insulating material using a photoresist pattern PR and the second gate electrode 134 as a mask.

Through the dry etching process, the insulating material may be etched to form the second gate insulating layer 115 on the second active layer 131. In addition, a portion of the second active layer 131 that is exposed by the second gate insulating layer 115 may be conductive by a dry etching process.

The second active layer 131 including the second channel region 131a that is not conductive corresponding to an area in which the second gate electrode 134 is formed, and the second source region 131b and the second drain region 131c that are conductive at both ends of the second active layer 131 may be formed. As a resistance of the second source region 131b and the second drain region 131c of the second active layer 131 that are conductive is lowered, element performance of the second thin film transistor 130 may be improved and accordingly, it is possible to obtain an effect that reliability of the organic light emitting display device 100 according to the exemplary embodiment of the present disclosure can be improved.

The second channel region 131a of the second active layer 131 may be disposed to overlap the second gate electrode 134. In addition, the second source region 131b and the second drain region 131c of the second active layer 131 may be disposed on both sides of the second channel region 131a. In addition, the second gate insulating layer 115 may be disposed between the second gate electrode 134 and the second active layer 131. In addition, the second gate insulating layer 115 may be disposed to overlap the second gate electrode 134 and the second channel region 131a of the second active layer 131.

As the insulating material and the metallic material are etched using the photoresist pattern PR as a mask, the second gate insulating layer 115 and the second gate electrode 134 may be formed in the same pattern. The second gate insulating layer 115 may be disposed on the second active layer 131. The second gate insulating layer 115 may be composed of a single layer of silicon nitride (SiNx) or silicon oxide (SiOx) or multiple layers thereof.

The second gate insulating layer 115 may be patterned to overlap the second channel region 131a of the second active layer 131. The second gate electrode 134 may be disposed on the second gate insulating layer 114. The second gate electrode 134 may be formed as a single layer or multilayer composed of any one of molybdenum (Mo), copper (Cu), titanium (Ti), aluminum (Al), chromium (Cr), gold (Au), nickel (Ni), and neodymium (Nd), or an alloy of them. The second gate electrode 134 may be patterned to overlap the second active layer 131 and the second gate insulating layer 115. The second gate electrode 134 may be patterned to overlap the second channel region 131a of the second active layer 131. The second gate insulating layer 115 may be patterned to overlap the second channel region 131a of the second active layer 131. That is, the second gate electrode 134 and the second gate insulating layer 115 may overlap the second channel region 131a of the second active layer 131.

The second interlayer insulating layer 116 may be disposed on the second buffer layer 114, the second active layer 131, and the second gate electrode 134. Contact holes for exposing the first active layer 121 of the first thin film transistor 120 and the second active layer 131 of the second thin film transistor 130 may be formed in the second interlayer insulating layer 116. For example, contact holes for exposing the first source region 121b and the first drain region 121c of the first active layer 121 in the first thin film transistor 120 may be formed in the second interlayer insulating layer 116. In addition, contact holes for exposing the second source region 131b and the second drain region 131c of the second active layer 131 in the second thin film transistor 130 may be formed in the second interlayer insulating layer 116. The second interlayer insulating layer 116 may be composed of a single layer of silicon nitride (SiNx) or silicon oxide (SiOx) or multiple layers thereof.

On the second interlayer insulating layer 116, the connection electrode 150, the first source electrode 122 and the second drain electrode 123 of the first thin film transistor 120, and the second source electrode 132 and the second drain electrode 133 of the second thin film transistor 130 may be disposed.

Here, the first source electrode 122 and the first drain electrode 123 of the first thin film transistor 120 may be connected to the first active layer 121 of the first thin film transistor 120 through the contact holes formed in the first gate insulating layer 112, the first interlayer insulating layer 113, the second buffer layer 114, and the second interlayer insulating layer 116. Accordingly, the first source electrode 122 of the first thin film transistor 120 may be connected to the first source region 121b of the first active layer 121 through the contact hole formed in the first gate insulating layer 112, the first interlayer insulating layer 113, the second buffer layer 114, and the second interlayer insulating layer 116. In addition, the first drain electrode 123 of the first thin film transistor 120 may be connected to the first drain region 121c of the first active layer 121 through the contact hole formed in the first gate insulating layer 112, the first interlayer insulating layer 113, the second buffer layer 114, and the second interlayer insulating layer 116.

The connection electrode 150 may be electrically connected to the second drain electrode 133 of the second thin film transistor 130. In addition, the connection electrode 150 may be electrically connected to the second capacitor electrode 142 of the storage capacitor 140 through a contact hole formed in the second buffer layer 114 and the second interlayer insulating layer 116. Accordingly, the connection electrode 150 may serve to electrically connect the second capacitor electrode 142 of the storage capacitor 140 and the second drain electrode 133 of the second thin film transistor 130.

In addition, the second source electrode 132 and the second drain electrode 133 of the second thin film transistor 130 may be connected to the second active layer 131 through contact holes formed in the second interlayer insulating layer 116. Accordingly, the second source electrode 132 of the second thin film transistor 130 may be connected to the second source region 131b of the second active layer 131 through the contact hole formed in the second interlayer insulating layer 116, and the second drain electrode 133 of the second thin film transistor 130 may be connected to the second drain region 131c of the second active layer 131 through the contact hole formed in the second interlayer insulating layer 116.

The connection electrode 150, the first source electrode 122 and the second drain electrode 123 of the first thin film transistor 120, and the second source electrode 132 and the second drain electrode 133 of the second thin film transistor 130 may be formed by the same process. In addition, the connection electrode 150, the first source electrode 122 and the second drain electrode 123 of the first thin film transistor 120, and the second source electrode 132 and the second drain electrode 133 of the second thin film transistor 130 may be formed of the same material. The connection electrode 150, the first source electrode 122 and the second drain electrode 123 of the first thin film transistor 120, and the second source electrode 132 and the second drain electrode 133 of the second thin film transistor 130 may be formed as a single layer or multilayer composed of any one of molybdenum (Mo), copper (Cu), titanium (Ti), aluminum (Al), chromium (Cr), gold (Au), nickel (Ni), and neodymium (Nd), or an alloy of them. For example, the connection electrode 150, the first source electrode 122 and the second drain electrode 123 of the first thin film transistor 120, and the second source electrode 132 and the second drain electrode 133 of the second thin film transistor 130 may have a three-layer structure of titanium (Ti)/aluminum (Al)/titanium (Ti), but the present disclosure is not limited thereto.

The connection electrode 150 may be integrally formed with the second drain electrode 133 of the second thin film transistor 130 and connected thereto.

The first planarization layer 117 may be disposed on the connection electrode 150, the first source electrode 122 and the second drain electrode 123 of the first thin film transistor 120, the second source electrode 132 and the second drain electrode 133 of the second thin film transistor 130, and the second interlayer insulating layer 116. In this case, as shown in FIG. 4, a contact hole for exposing the second drain electrode 133 may be formed in the first planarization layer 117, but is not limited thereto. The first planarization layer 117 may be an organic layer for planarizing and protecting upper portions of the first thin film transistor 120 and the second thin film transistor 130. For example, the planarization layer 118 may be formed of an organic material such as an acrylic resin, an epoxy resin, a phenolic resin, a polyamide resin, or a polyimide resin.

The auxiliary electrode 160 may be disposed on the first planarization layer 117. In addition, the auxiliary electrode 160 may be connected to the second drain electrode 133 of the second thin film transistor 130 through the contact hole of the first planarization layer 117. The auxiliary electrode 160 may serve to electrically connect the second thin film transistor 130 and the first electrode 170. The auxiliary electrode 160 may be formed as a single layer or multilayer composed of any one of molybdenum (Mo), copper (Cu), titanium (Ti), aluminum (Al), chromium (Cr), gold (Au), nickel (Ni), and neodymium (Nd), or an alloy of them. The auxiliary electrode 160 may be formed of the same material as the second source electrode 132 and the second drain electrode 133 of the second thin film transistor 130.

The second planarization layer 118 may be disposed on the auxiliary electrode 160 and the first planarization layer 117. As shown in FIG. 4, a contact hole for exposing the auxiliary electrode 160 may be formed in the second planarization layer 118. The second planarization layer 118 may be an organic layer for planarizing upper portions of the first thin film transistor 120 and the second thin film transistor 130. For example, the second planarization layer 118 may be formed of an organic material such as an acrylic resin, an epoxy resin, a phenolic resin, a polyamide resin, and a polyimide resin.

The first electrode 170 may be disposed on the second planarization layer 118. The first electrode 170 may be electrically connected to the auxiliary electrode 160 through the contact hole formed in the second planarization layer 118. Accordingly, the first electrode 170 may be connected to the auxiliary electrode 160 through the contact hole formed in the second planarization layer 118 and thus, electrically connected to the second thin film transistor 130.m The first electrode 170 may be formed in a multilayer structure including a transparent conductive layer and an opaque conductive layer having high reflective efficiency. The transparent conductive layer may be formed of a material having a relatively large work function value, such as indium-tin-oxide (ITO) or indium-zinc-oxide (IZO). In addition, the opaque conductive layer may have a single layer or multilayer structure including Al, Ag, Cu, Pb, Mo, and Ti, or an alloy thereof. For example, the first electrode 170 may be formed in a structure in which a transparent conductive layer, an opaque conductive layer, and a transparent conductive layer are sequentially stacked. However, the present disclosure is not limited thereto, and a structure in which a transparent conductive layer and an opaque conductive layer are sequentially stacked may also be formed.

Since the organic light emitting display device 100 according to the exemplary embodiment of the present disclosure is a top emission display device, the first electrode 170 may be an anode electrode. When the organic light emitting display device 100 is a bottom emission display device, the first electrode 170 disposed on the second planarization layer 118 may be a cathode electrode.

The bank 180 may be disposed on the first electrode 170 and the second planarization layer 118. An opening for exposing the first electrode 170 may be formed in the bank 180. The bank 180 may define a light emitting area of the organic light emitting display device 100 and thus may be referred to as a pixel defining layer. The spacer 190 may be further disposed on the bank 180. In addition, the light emitting structure 200 including a light emitting layer may be further disposed on the first electrode 170.

The light emitting structure 200 may be formed by stacking a hole layer, the light emitting layer, and an electron layer on the first electrode 170 in the order or in a reverse order. In addition, the light emitting structure 200 may include a first light emitting structure and a second light emitting structure that face each other with a charge generating layer interposed therebetween. In this case, the light emitting layer of any one of the first and second light emitting structures generates blue light, and the light emitting layer of the other of the first and second light emitting structures generates yellow-green light, so that white light may be generated through the first and second light emitting structures. White light generated by the light emitting structure 200 may be incident on a color filter (not shown) positioned on the light emitting structure 200 to implement a color image. In addition, a color image may be implemented by generating colored light corresponding to each sub-pixel in each light emitting structure 200 without a separate color filter. That is, the light emitting structure 200 of the red (R) sub-pixel may generate red light, the light emitting structure 200 of the green (G) sub-pixel may generate green light, and the light emitting structure 200 of the blue (B) sub-pixel may generate blue light.

The second electrode 210 may be further disposed on the light emitting structure 200. The second electrode 210 may be disposed on the light emitting structure 200 to face the first electrode 170 with the light emitting structure 200 interposed therebetween. In the organic light emitting display device 100 according to the exemplary embodiment of the present disclosure, the second electrode 210 may be a cathode electrode. The encapsulation units 220a, 220b, and 220c for suppressing penetration of moisture may be further disposed on the second electrode 210.

The encapsulation units 220a, 220b, and 220c may include a first inorganic encapsulation layer 220a, a second organic encapsulation layer 220b, and a third inorganic encapsulation layer 220c. The first inorganic encapsulation layer 220a of the encapsulation units 220a, 220b, and 220c may be disposed on the second electrode 210. In addition, the second organic encapsulation layer 220b may be disposed on the first inorganic encapsulation layer 220a. Also, the third inorganic encapsulation layer 220c may be disposed on the second organic encapsulation layer 220b. The first inorganic encapsulation layer 220a and the third inorganic encapsulation layer 220c of the encapsulation units 220a, 220b, and 220c may be formed of an inorganic material such as silicon nitride (SiNx) or silicon oxide (SiOx). The second organic encapsulation layer 220b of the encapsulation units 220a, 220b, and 220c may be formed of an organic material such as an acrylic resin, an epoxy resin, a phenolic resin, a polyamide resin, and a polyimide resin.

Meanwhile, the organic light emitting display device 100 according to the exemplary embodiment of the present disclosure configured as described above, is characterized in that the first active layer 121 under the contact hole of the first thin film transistor 120, that is, the LIPS thin film transistor, is designed asymmetrically to thereby be in side contact with the source and drain electrodes 122 and 123. In other words, at least one of the first source electrode 122 and the first drain electrode 123 may be connected to the first active layer 121 through one or more first contact holes in the first gate insulating layer 112, the first interlayer insulating layer 113, the second buffer layer 114, and the second interlayer insulating layer 116. The first contact holes may expose at least a side surface of the first active layer 121, and at least one of the first source electrode 122 or the first drain electrode 123 may contact the exposed side surface of the first active layer 121.

For example, the first source electrode 122 may be connected to the source region 121b through a first source contact hole that exposes a side surface of the active layer 121 in the source region 121b. The first source electrode 122 may contact the side surface of the first active layer 121. Similarly, the drain electrode 123 may be connected to the drain region 121c through a first drain contact hole that exposes a side surface of the active layer 121 in the drain region 121c. The first drain electrode 123 may contact the side surface of the first active layer 121.

That is, recently, in information technology (IT) devices such as mobile phones and smart watches, an LTPS thin film transistor and an oxide semiconductor thin film transistor are formed together on the same substrate to reduce power consumption.

Meanwhile, as a plurality of thin film transistors are formed on different layers, there is a problem in that, when a contact hole of the LTPS thin film transistor is formed, a residual inorganic layer remains or etch uniformity is lowered due to an insulating layer stacked with a thick thickness. For example, the insulating film in a contact hole area of the LTPS thin film transistor has a thickness thicker than that of an existing one by about 6,500 Å. As the thickness of the insulating layer increases, the etch uniformity is lowered when the contact hole is formed, resulting in luminance differences in respective areas, and unevenness or spot defects in a display panel may occur due to an increase in S-factor distribution of the driving transistor.

Accordingly, the present disclosure is characterized in that the first active layer 121 under the contact hole of the first thin film transistor 120, that is, the LTPS thin film transistor, is designed asymmetrically to thereby be in side contact with the source and drain electrodes 122 and 123, so that an influence of a residual inorganic layer within the contact hole is reduced.

Figure 5A:
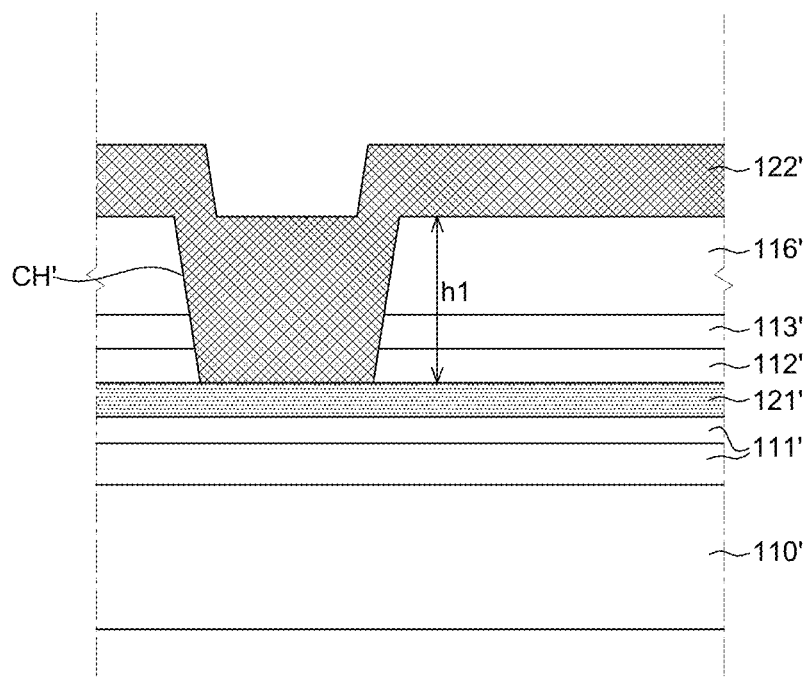
FIGS. 5A and 5B are cross-sectional views of contact areas in LIPS thin film transistors according to embodiments of the present disclosure.
Figure 5B:
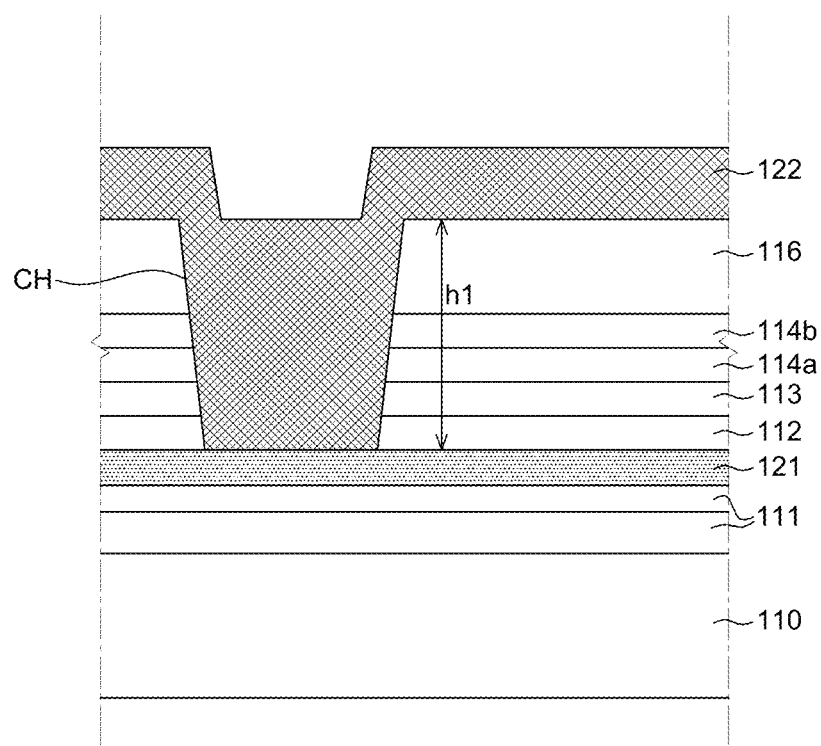

FIGS. 5A and 5B are cross-sectional views of contact areas in LIPS thin film transistors according to embodiments of the present disclosure.

Figure 6A:
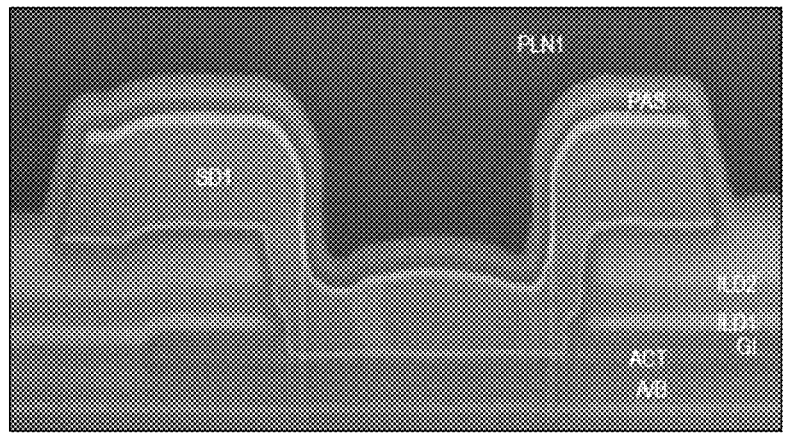
FIGS. 6A and 6B are photographs showing the contact areas of FIGS. 5A and 5B.
Figure 6B:
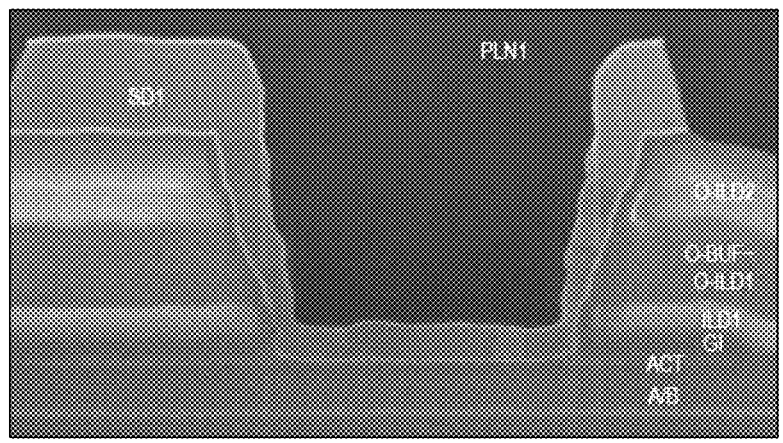

FIGS. 6A and 6B are photographs showing the contact areas of FIGS. 5A and 5B.

FIGS. 5A and 6A show a contact area in an LIPS thin film transistor of a comparative example having a single type thin film transistor as an example, and FIGS. 5B and 6B show a contact area in an LIPS thin film transistor according to an exemplary embodiment of the present disclosure which has a multi-type thin film transistor, as an example.

Referring to FIGS. 5A and 6A, in the LIPS thin film transistor of the comparative example, a buffer layer 111' is disposed on a substrate 110', and an active layer 121' is disposed on the buffer layer 111'.

A gate insulating layer 112', a first interlayer insulating layer 113', and a second interlayer insulating layer 116' are sequentially disposed on the active layer 121'.

A source electrode 122' is disposed on the second interlayer insulating layer 116' and is electrically connected to the active layer 121' through a contact hole CH'.

The contact hole CH' of the comparative example is formed by removing the gate insulating layer 112', the first interlayer insulating layer 113', and the second interlayer insulating layer 116', and may have a depth h1 of about 8,800 Å, by way of example.

The buffer layer 111', the gate insulating layer 112', the first interlayer insulating layer 113' and the second interlayer insulating layer 116' of FIG. 5A may correspond to A/B and ACT, GI, ILD1 and ILD2 of FIG. 6A, respectively. In addition, SD1 and PLN1 may correspond to a source electrode and a first planarization layer, respectively.

On the other hand, referring to FIGS. 5B and 6B, in the LIPS thin film transistor according to an exemplary embodiment of the present disclosure, the first buffer layer 111 is disposed on the substrate 110, and the first active layer 121 may be disposed on the first buffer layer 111.

Then, the first gate insulating layer 112, the first interlayer insulating layer 113, the second buffer layers 114a and 114b, and the second interlayer insulating layer 116 may be sequentially disposed on the first active layer 121.

The source electrode 122 may be disposed on the second interlayer insulating layer 116 and may be electrically connected to the first active layer 121 through the contact hole CH.

The contact hole CH according to the exemplary embodiment of the present disclosure may be formed by removing the first gate insulating layer 112, the first interlayer insulating layer 113, the second buffer layers 114a and 114b, and the second interlayer insulating layer 116, and may have a depth h2 of about 15,300 Å.

The first buffer layer 111, the first gate insulating layer 112, the first interlayer insulating layer 113, the second buffer layers 114a and 114b, and the second interlayer insulating layer 116 of FIG. 5B may correspond to A/B and ACT, GI, ILD1, O-BUF to O-ILD1, and O-ILD2 of FIG. 6B, respectively.

As described above, in the LTPS thin film transistor according to the exemplary embodiment of the present disclosure having the multi-type thin film transistor, it can be seen that a total thickness of the insulating layers in the contact hole area is thicker than that of an existing one by about 6,500 Å.

Figure 7:
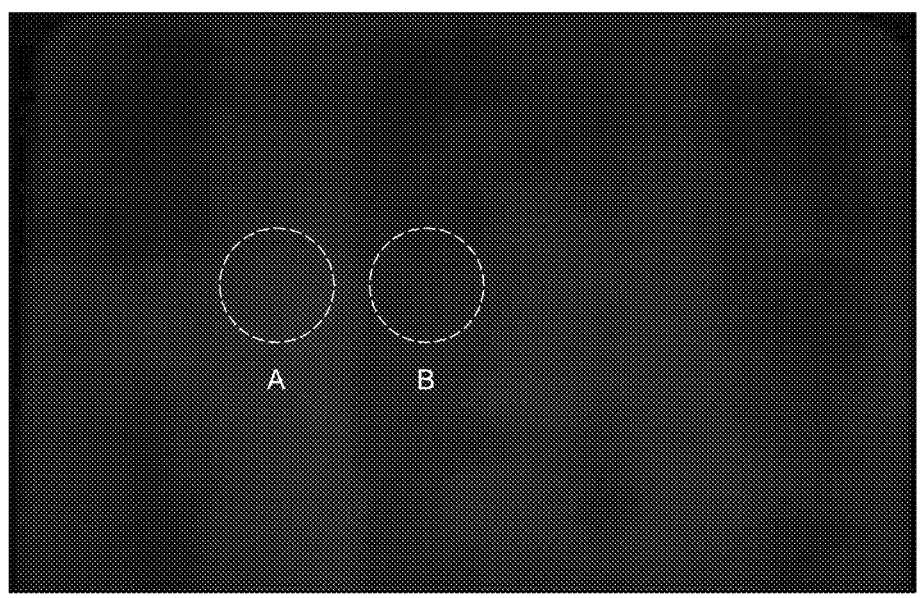
FIG. 7 is a photograph showing a portion of a pixel of a comparative example.

FIG. 7 is a photograph showing a portion of a pixel of a comparative example.

Figure 8A:
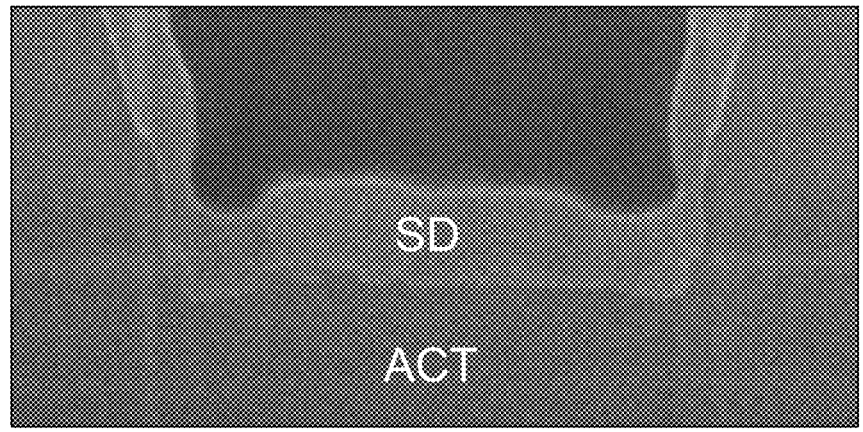
FIGS. 8A and 8B are photographs showing area A and area B of FIG. 7.
Figure 8B:
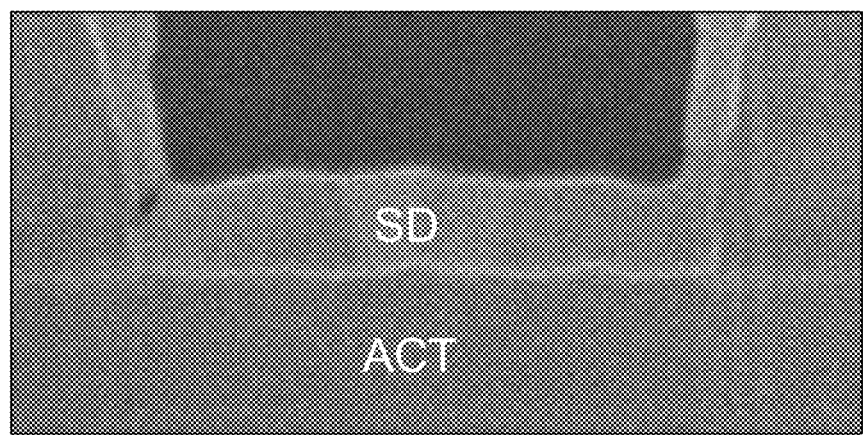

FIGS. 8A and 8B are photographs showing area A and area B of FIG. 7.

FIGS. 7, 8A, and 8B show a portion of a pixel of a comparative example having a multi-type thin film transistor but having a symmetric shape of an active layer under a contact hole.

SD and ACT shown in FIGS. 8A and 8B may correspond to a source electrode and an active layer, respectively.

Referring to FIGS. 7, 8A, and 8B, in the case of the multi-type thin film transistor, it can be seen that a total thickness of insulating layers in a contact hole area of the LIPS thin film transistor is thicker as compared to an existing one.

Meanwhile, when the shape of the active layer under the contact hole has symmetry as in the comparative example, a decrease in etch uniformity may not be solved due to the thick thickness of the insulating layers. As a result, it can be seen that a residual inorganic layer remains or uniformity of contact resistance is lowered, so that luminance differences occur in respective areas. That is, while FIG. 8A shows a normal luminance, FIG. 8B shows a dark spot due to a residual inorganic layer remaining.

Accordingly, in the exemplary embodiment of the present disclosure, the active layer under the contact hole of the LTPS thin film transistor is designed asymmetrically to thereby be in side contact with the source and drain electrodes, so that the influence of the remaining inorganic layer is minimized or reduced in the contact area.

Figure 9:
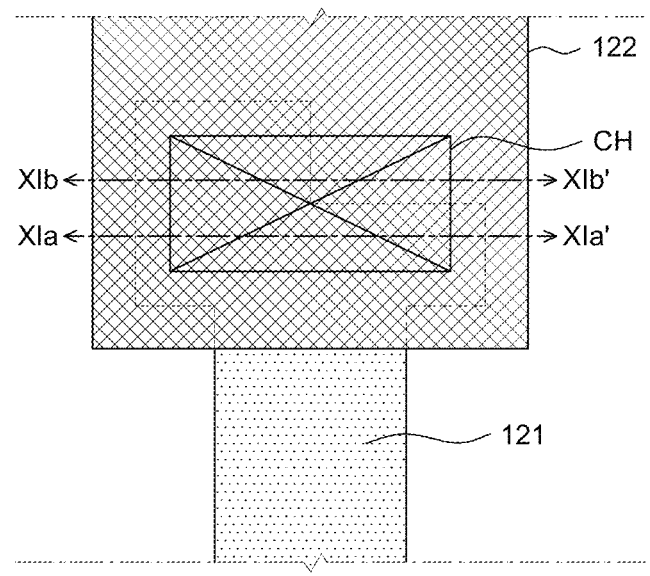
FIG. 9 is a plan view schematically illustrating a contact area according to an exemplary embodiment of the present disclosure.

FIG. 9 is a plan view schematically illustrating a contact area according to an exemplary embodiment of the present disclosure.

Figure 10A:
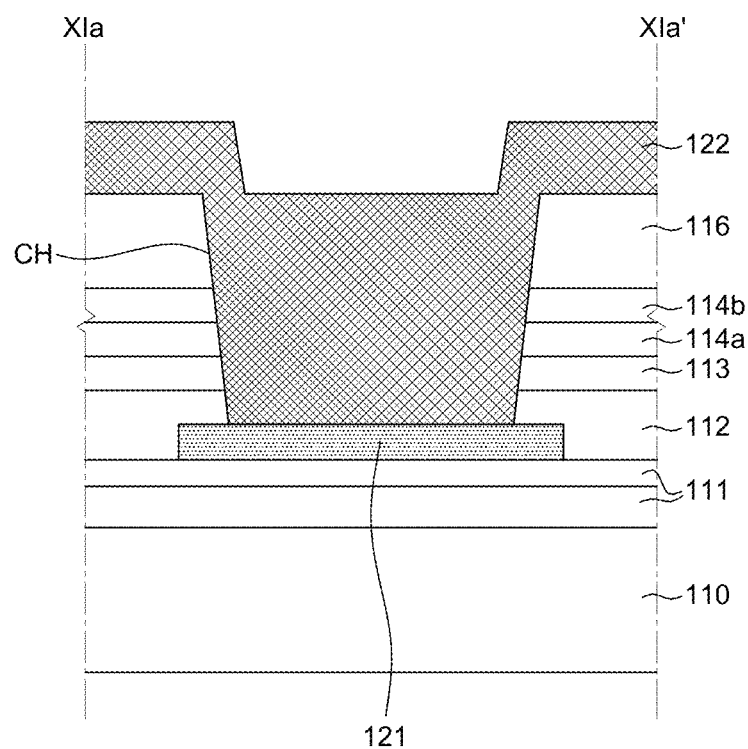
FIGS. 10A and 10B are cross-sectional views taken along lines XIa-XIa' and XIb-XIb' of FIG. 9 according to embodiments of the present disclosure.
Figure 10B:
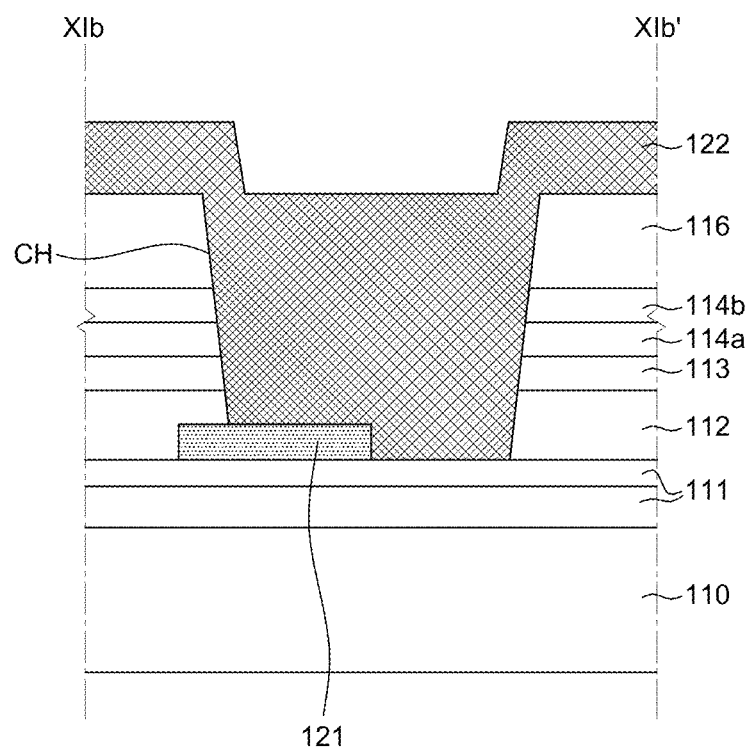

FIGS. 10A and 10B are cross-sectional views taken along lines XIa-XIa' and XIb-XIb' of FIG. 9 according to embodiments of the present disclosure.

Referring to FIGS. 9 and 10A and 10B, in the first thin film transistor according to an exemplary embodiment of the present disclosure, the first active layer 121 under the contact hole CH may have an asymmetric structure.

Accordingly, it is characterized in that a portion of the first source electrode 122 is in contact with an upper surface of the first active layer 121, while another portion of the first source electrode 122 is in contact with the upper surface and a side surface of the first active layer 121 exposed through the contact hole CH. Moreover, when the first buffer layer 111 is disposed below the first active layer 121, the portion of the first source electrode 122 may also extend to contact the first buffer layer 111 exposed through the contact hole CH. In this case, the first source electrode 122 is exemplified, but the present disclosure is not limited thereto, and a portion of the first drain electrode may be in contact with the upper surface of the first active layer 121, while another portion of the first drain electrode may be in contact with the upper surface and a side surface of the first active layer 121 exposed through a contact hole. The another portion of the first drain electrode 123 may also extend to contact the first buffer layer 111 exposed through the contact hole.

Here, the first active layer 121 under the contact hole CH means the first active layer 121 that includes a contact area under the contact hole CH in the first active layer 121.

As described above, since the first source electrode 122 of the present disclosure contacts not only the upper surface but also the side surface of the first active layer 121, thereby increasing a contact area, so that a device influence due to the remaining inorganic layer in the contact area can be reduced or minimized. Accordingly, it is possible to reduce non-uniformity of contact resistance in the contact area and reduce unevenness or spots defect.

Meanwhile, in the second thin film transistor of the present disclosure, the second active layer under the contact hole may have a symmetrical structure, but is not limited thereto.

For example, although FIG. 9 illustrates that the first active layer 121 under the contact hole CH has a structure having top and bottom asymmetry and left and right asymmetry, as an example, the present disclosure is not limited thereto, and the first active layer 121 under the contact hole CH has a structure having top and bottom asymmetry or left and right asymmetry. For example, the contact hole CH connecting the first source electrode 122 or the first drain electrode 123 to respective regions of the first active layer 121 may expose at least a portion of the first active layer 121. As shown in FIG. 9, a top surface of the exposed portion of the first active layer 121 may be shaped asymmetrically with respect to a reference line extending in a first direction, such that a portion of the first active layer 121 on one side of the reference line is shaped differently from another portion of the first active layer 121 on the other side of the reference line. For example, the first direction may be a vertical direction in FIG. 9 extending from a top edge of the contact hole CH to a bottom edge of the contact hole CH, or a horizontal direction extending from a left edge of the contact hole CH to a right edge of the contact hole CH. Moreover, the top surface of the exposed portion may be shaped asymmetrically with respect to a reference line extending in a first direction (e.g., vertical direction) and a second direction intersecting the first direction (e.g., horizontal direction).

In addition, an edge of the first active layer 121 under the contact hole CH may have a curved shape rather than a straight edge, or may have an uneven shape in which the edge is bent several times.

The exemplary embodiments of the present disclosure can also be described as follows.

According to an aspect of the present disclosure, there is provided an organic light emitting display device. The organic light emitting display device includes a first thin film transistor disposed above a substrate and including a first active layer that is formed of a first material and includes a first source region, a first channel region, and a first drain region, a first gate electrode that overlaps the first active layer with a first gate insulating layer interposed therebetween, and a first source electrode and a first drain electrode that are electrically connected to the first active layer, at least one insulating layer disposed on the first gate electrode and a second thin film transistor disposed on the insulating layer and including a second active layer that is formed of a second material and includes a second source region, a second channel region, and a second drain region, a second gate electrode that overlaps the second active layer with a second gate insulating layer interposed therebetween, and a second source electrode and a second drain electrode that are electrically connected to the second active layer, wherein the first source electrode and the first drain electrode are electrically connected to the first active layer through a first contact hole, and wherein the first active layer under the first contact hole has an asymmetric structure.

The organic light emitting display device may further include a light emitting element disposed over the second thin film transistor and including an anode, a light emitting layer, and a cathode.

The substrate may include a first substrate, a second substrate, and an inorganic insulating layer disposed between the first substrate and the second substrate.

The first substrate and the second substrate may be made of polyimide (PI).

The organic light emitting display device may further include a first buffer layer disposed on the second substrate.

The at least one insulating layer may include a first interlayer insulating layer and a second buffer layer.

The organic light emitting display device may further include a second interlayer insulating layer disposed on the second gate electrode.

The first source electrode, the first drain electrode, the second source electrode, and the second drain electrode may be disposed on the second interlayer insulating layer.

The second source electrode and the second drain electrode may be electrically connected to the second active layer through a second contact hole, and the second active layer under the second contact hole may be a symmetrical structure.

Portions of the first source electrode and the first drain electrode may be respectively in contact with an upper surface of the first active layer, and other portions of the first source electrode and the first drain electrode may be respectively in contact with the upper surface and a side surface of the first active layer.

The other portions of the of the first source electrode and the first drain electrode may be in contact with the first buffer layer.

The first active layer under the first contact hole may have a structure having top and bottom asymmetry and left and right asymmetry.

The first active layer under the first contact hole may have a structure having top and bottom asymmetry or left and right asymmetry.

An edge of the first active layer under the first contact hole may have a linear shape or a curved shape.

An edge of the first active layer under the first contact hole may have an uneven shape in which the edge may be bent several times.

The first active layer may be made of low-temperature polysilicon, and the second active layer may be made of an oxide semiconductor.

According to another aspect of the present disclosure, there is provided a light emitting display device a light emitting element, a first thin film transistor disposed on a substrate and including a first active layer formed of a first material and includes a first source region, a first channel region, and a first drain region, a first gate electrode overlapping the first active layer, a first gate insulating layer between the first active layer and the first gate electrode, and a first source electrode and a first drain electrode electrically connected to the first active layer. The light emitting display device may further include one or more insulating layers disposed on the first gate electrode, and a second thin film transistor disposed on the at least one insulating layer. At least one of the first source electrode or the first drain electrode may be electrically connected to the first active layer through a first contact hole in the one or more insulating layers that exposes a side surface of the first active layer, and the at least one of the first source electrode or the first drain electrode may contact the side surface of the first active layer.

The first material may include poly-silicon.

The second thin film transistor may further include a second active layer formed of a second material, and the second material may include oxide semiconductor.

The first active layer may be formed on a buffer layer, and the at least one of the first source electrode or the first drain electrode may contact a top surface of the buffer layer.

The first contact hole may expose at least a portion of the first active layer including the side surface of the first active layer.

A top surface of the exposed portion of the first active layer may be shaped asymmetrically with respect to a reference line extending in a first direction.

The top surface of the exposed portion of the first active layer may be shaped asymmetrically with respect to another reference line extending in a second direction intersecting the first direction.

An edge of the exposed portion of the first active layer may have a curved shape or a shape having one or more bent portions.

The second thin film transistor may further include a second active layer, a second source electrode and a second drain electrode electrically connected to the second active layer. At least one of the second source electrode or the second drain electrode may contact a top surface of the second active layer.

The light emitting display device may further include at least one interlayer insulating layer on the second thin film transistor, and at least a part of the first source electrode, the first drain electrode, the second source electrode, and the second drain electrode may be disposed on the at least one interlayer insulating layer.

The first thin film transistor and the second thin film transistor may be formed on the same substrate.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
    a first thin film transistor disposed above a substrate and including:
        a first active layer that is formed of a first material and includes a first source region, a first channel region, and a first drain region,
        a first gate electrode that overlaps the first active layer with a first gate insulating layer interposed therebetween, and
        a first source electrode and a first drain electrode that are electrically connected to the first active layer;
    at least one insulating layer disposed on the first gate electrode; and
    a second thin film transistor disposed on the insulating layer and including:
        a second active layer that is formed of a second material and includes a second source region, a second channel region, and a second drain region,
        a second gate electrode that overlaps the second active layer with a second gate insulating layer interposed therebetween, and
        a second source electrode and a second drain electrode that are electrically connected to the second active layer,
    wherein the first source electrode or the first drain electrode is electrically connected to the first active layer through a first contact hole,
    wherein an upper surface of the first active layer extends in a first direction, a side surface of the first active layer extends in a second direction different from the first direction, and wherein the upper surface and the side surface of the first active layer are in contact with the first source electrode or the first drain electrode, and
    wherein a portion of the first active layer in contact with the first source electrode or the first drain electrode is asymmetric in top-bottom or left-right shape when viewed from a plan view.

2. The organic light emitting display device of claim 1, further comprising:
    a light emitting element disposed over the second thin film transistor and including an anode, a light emitting layer, and a cathode.

3. The organic light emitting display device of claim 1, wherein the substrate includes a first substrate, a second substrate, and an inorganic insulating layer disposed between the first substrate and the second substrate.

4. The organic light emitting display device of claim 3, the first substrate and the second substrate are made of polyimide (PI).

5. The organic light emitting display device of claim 3, further comprising:
    a first buffer layer disposed on the second substrate.

6. The organic light emitting display device of claim 5, wherein portions of the first source electrode and the first drain electrode are respectively in contact with the upper surface of the first active layer, and other portions of the first source electrode and the first drain electrode are respectively in contact with the side surface of the first active layer.

7. The organic light emitting display device of claim 6, wherein the other portions of the of the first source electrode and the first drain electrode are in contact with the first buffer layer.

8. The organic light emitting display device of claim 1, wherein the at least one insulating layer includes a first interlayer insulating layer and a second buffer layer.

9. The organic light emitting display device of claim 8, further comprising:
    a second interlayer insulating layer disposed on the second gate electrode.

10. The organic light emitting display device of claim 9, wherein the first source electrode, the first drain electrode, the second source electrode, and the second drain electrode are disposed on the second interlayer insulating layer.

11. The organic light emitting display device of claim 9, wherein the second source electrode or the second drain electrode is electrically connected to the second active layer through a second contact hole, and
    wherein the second active layer under the second contact hole has a symmetrical structure.

12. The organic light emitting display device of claim 1, wherein an edge of the first active layer under the first contact hole has a linear shape or a curved shape.

13. The organic light emitting display device of claim 1, wherein an edge of the first active layer under the first contact hole has an uneven shape in which the edge is bent one or more times.

14. The organic light emitting display device of claim 1, wherein the first active layer is made of low-temperature polysilicon, and
    wherein the second active layer is made of an oxide semiconductor.

15. A light emitting display device, comprising:
    a light emitting element;
    a first thin film transistor disposed on a substrate and including:
        a first active layer formed of a first material and includes a first source region, a first channel region, and a first drain region,
        a first gate electrode overlapping the first active layer,
        a first gate insulating layer between the first active layer and the first gate electrode, and
        a first source electrode and a first drain electrode electrically connected to the first active layer;
    one or more insulating layers disposed on the first gate electrode; and
    a second thin film transistor disposed on at least one of the one or more insulating layers,
    wherein at least one of the first source electrode or the first drain electrode is electrically connected to the first active layer through a first contact hole in the one or more insulating layers that exposes a side surface of the first active layer, and wherein an upper surface of the first active layer extends in a first direction, the side surface of the first active layer extends in a second direction different from the first direction, and wherein the upper surface and the side surface of the first active layer are in contact with the first source electrode or the first drain electrode, and wherein a portion of the first active layer in contact with the first source electrode or the first drain electrode is asymmetric in top-bottom or left-right shape when viewed from a plan view.

16. The light emitting device of claim 15, wherein the first material includes poly-silicon.

17. The light emitting device of claim 15, wherein the second thin film transistor includes a second active layer formed of a second material, and wherein the second material includes oxide semiconductor.

18. The light emitting device of claim 15, wherein the first active layer is formed on a buffer layer, and wherein the at least one of the first source electrode or the first drain electrode contacts a top surface of the buffer layer.

19. The light emitting device of claim 15, wherein the first contact hole exposes at least a portion of the first active layer including the side surface of the first active layer.

20. The light emitting device of claim 19, wherein a top surface of the exposed portion of the first active layer is shaped asymmetrically with respect to a reference line extending in the first direction.

21. The light emitting device of claim 20, wherein the top surface of the exposed portion of the first active layer is shaped asymmetrically with respect to another reference line extending in the second direction intersecting the first direction.

22. The light emitting device of claim 19, wherein an edge of the exposed portion of the first active layer has a curved shape or a shape having one or more bent portions.

23. The light emitting device of claim 15, wherein the second thin film transistor includes:
a second active layer,
a second source electrode and a second drain electrode electrically connected to the second active layer, wherein at least one of the second source electrode or the second drain electrode contacts a top surface of the second active layer.

24. The light emitting device of claim 23, further comprising at least one interlayer insulating layer on the second thin film transistor, and at least a part of the first source electrode, the first drain electrode, the second source electrode, and the second drain electrode are disposed on the at least one interlayer insulating layer.

25. The light emitting device of claim 15, wherein the first thin film transistor and the second thin film transistor are formed on a same substrate.

* * * * *